(12) United States Patent
Kuboyama et al.

(10) Patent No.: US 7,782,700 B2
(45) Date of Patent: Aug. 24, 2010

(54) SEMICONDUCTOR MEMORY DEVICE

(75) Inventors: Kenichi Kuboyama, Kanagawa (JP);
Hideaki Arima, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 12/420,275

(22) Filed: Apr. 8, 2009

(65) Prior Publication Data
US 2009/0256587 A1 Oct. 15, 2009

(30) Foreign Application Priority Data
Apr. 9, 2008 (JP) .............................. 2008-101411

(51) Int. Cl.
*G11C 7/00* (2006.01)
*G11C 5/14* (2006.01)
(52) U.S. Cl. ................ 365/222; 365/227; 365/233; 365/193; 365/189.07; 365/189.011; 326/30
(58) Field of Classification Search ............... 326/30, 326/86; 327/108, 112; 365/189.01, 189.09
See application file for complete search history.

(56) References Cited

U.S. PATENT DOCUMENTS

| 7,034,565 | B2 * | 4/2006 | Lee ............................ 326/30 |
| 7,208,973 | B2 * | 4/2007 | Kwon ......................... 326/30 |
| 7,439,760 | B2 * | 10/2008 | Nguyen ..................... 326/30 |
| 2004/0100837 | A1 | 5/2004 | Lee |
| 2006/0091900 | A1 * | 5/2006 | Kang et al. ................ 326/30 |
| 2007/0139071 | A1 * | 6/2007 | Nguyen ..................... 326/30 |
| 2008/0159026 | A1 * | 7/2008 | Oh et al. .................... 365/194 |
| 2009/0051389 | A1 * | 2/2009 | Nguyen ..................... 326/62 |

FOREIGN PATENT DOCUMENTS

JP 2004-310981 11/2004

* cited by examiner

*Primary Examiner*—Vibol Tan
(74) *Attorney, Agent, or Firm*—Young & Thompson

(57) ABSTRACT

In a semiconductor or memory device, a first ODT (On Die Termination) circuit is provided between a termination voltage port and a command input port. A first ODT controlling circuit is connected between the termination voltage port and the first ODT circuit, and detects a level of a voltage applied to the termination voltage port and controls the first ODT circuit to connect the termination voltage port and the command input port based on the detection result.

13 Claims, 6 Drawing Sheets

SEMICONDUCTOR MEMORY DEVICE

INCORPORATION BY REFERENCE

This patent application claims priority on convention based on Japanese Patent Application No. 2008-101411. The disclosure thereof is incorporated herein by reference.

BACKGROUND OF THE INVENTION

1. Field of the Invention

The present invention relates to a semiconductor memory device including an ODT (On Die Termination) circuit 2. Description of Related Art An operation speed of a PC, a server, a work station, and the like is increased. Then, amplitude of a signal is gradually reduced between semiconductor memory devices in order to minimize delay time in signal transmission. Accordingly, an impedance matching circuit called an ODT (On Die Termination) is mounted on the semiconductor memory device on a receiving side required to increase the operation speed as a countermeasure against noise and impedance mismatch.

FIG. 1 shows a configuration of a semiconductor memory device disclosed in Japanese Patent Application Publication (JP-P2004-310981A) as a conventional semiconductor memory device. The semiconductor memory device includes an ODT (On Die Termination) circuit 30, a pull-up transistor PM and a pull-down transistor NM in an output buffer, and an input buffer 31.

The pull-up transistor PM and the pull-down transistor NM are connected in series to each other. The pull-up transistor PM is connected to a supply voltage node to which a power supply voltage VDDQ is supplied. The pull-down transistor NM is connected to a ground voltage node to which a ground voltage VSSQ is supplied. An input of the input buffer 31 is connected to an intermediate node between the pull-up transistor PM and the pull-down transistor NM. A data input/output port DQ is connected to the intermediate node.

The ODT circuit 30 is provided between a termination voltage port VTT and the intermediate node. The ODT circuit 30 includes a termination resistance R-term1 and a switch TM. The intermediate node is connected to one end of the termination resistance R-term1. The switch TM is provided between the other end of the termination resistance R-term1 and the termination voltage port VTT. The switch TM is a transfer gate including an n-type MOS transistor and a p-type MOS transistor. The switch TM selectively couples the termination voltage port VTT with the other end of the termination resistance R-term1 in response to a termination enable signal DQ_TE and an inverted signal DQ_TEB thereof.

As described above, in the semiconductor memory device, terminations of the data input/output port DQ and of a transmission line DB connected to the data input/output port DQ are required to suppress reflection of input data. Since the data input/output port DQ is provided for an input/output bidirectional bus, the ODT circuit 30 is disabled in a read mode and the ODT circuit 30 is enabled in other modes Although a clear description is not found in the above-mentioned Japanese Patent Application Publication (JP-P2004-310981A), the enable state and the disabled state are controlled through a logic operation with a read mode, by newly adding an MRS (Mode Resister Set) control circuit or newly adding a memory controller and an ID (Identity) register, for the ODT control of the data input/output port DQ.

However, an address/command system signal also needs to be terminated in the ODT circuit as an operation frequency increases. In case of mounting the ODT circuit of the address/command system on a synchronous semiconductor memory device, a complex dedicated design for timing control is required for the ODT enable/disenable control. That is, an address/command input for control by the ODT circuit to the data input/output port DQ requires a control by another ODT circuit. In addition, a control logical circuit dedicated to that control is required, which increases a circuit size.

SUMMARY

In an aspect of the present invention, a semiconductor memory device includes a first ODT (On Die Termination) circuit provided between a termination voltage port and a command input port, and a first ODT controlling circuit connected between the termination voltage port and the first ODT circuit, and configured to detect a level of a voltage applied to the termination voltage port and to control the first ODT circuit to connect the termination voltage port and the command input port based on the detection result.

In another aspect of the present invention, a semiconductor memory device includes an ODT circuit provided between a termination voltage port and a data I/O port, a first ODT controlling circuit connected with the termination voltage port and configured to detect a level of a voltage applied to the termination voltage port and outputs the detection result, and a second ODT controlling circuit connected between the command input port and the ODT circuit and control the ODT circuit to connect the termination voltage port and the data I/O port based on an input to the command input port and the detection result from the first ODT controlling circuit.

In still another aspect of the present invention, a termination method is achieved by detecting a voltage level of a voltage applied to a termination voltage port; and by controlling a first ODT (On Die Termination) circuit provided between a termination voltage port and a command input port to connect the termination voltage port and the command input port, based on the detection result.

In yet still another aspect of the present invention, a termination method is achieved by detecting a level of a voltage applied to a termination voltage port to output the detection result; and by controlling an ODT circuit provided between the termination voltage port and the data I/O port to connect the termination voltage port and the data I/O port based on the detection result and an input to the command input port.

According to the semiconductor memory device of the present invention, the termination voltage (VTTP) is an essential power supply in case of providing first ODT circuits. When an enable state and disable state of the first ODT circuits are controlled by using a voltage level of a voltage applied to a termination voltage port (VVT), the address/command ODT circuits can be controlled without unnecessary address setting and a dedicated control circuit in the initialization.

BRIEF DESCRIPTION OF THE DRAWINGS

The above and other objects, advantages and features of the present invention will be more apparent from the following description of certain embodiments taken in conjunction with the accompanying drawings, in which.

DESCRIPTION OF THE PREFERRED EMBODIMENTS

Hereinafter, a semiconductor memory device according to the present invention will be described in detail, with reference to the attached drawings.

First Embodiment

Figure 1:
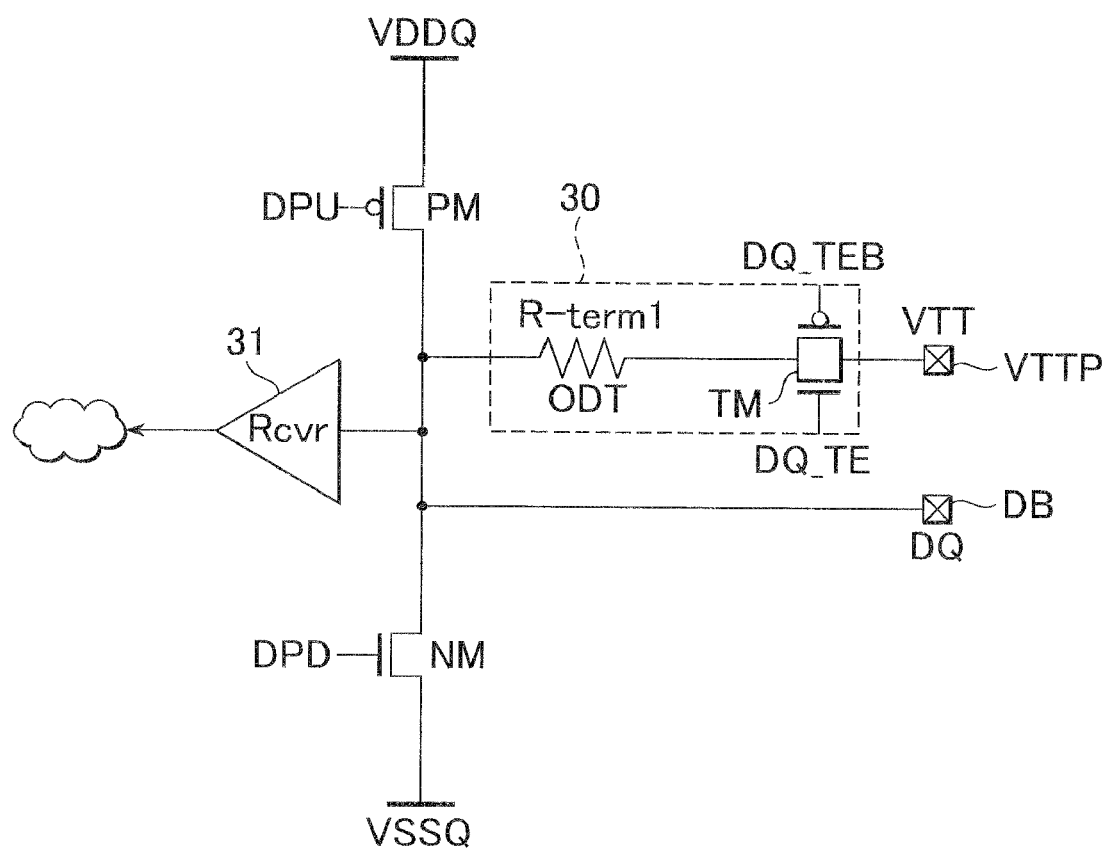
FIG. 1 is a circuit diagram showing a configuration of a semiconductor memory device in a related art.
Figure 2:
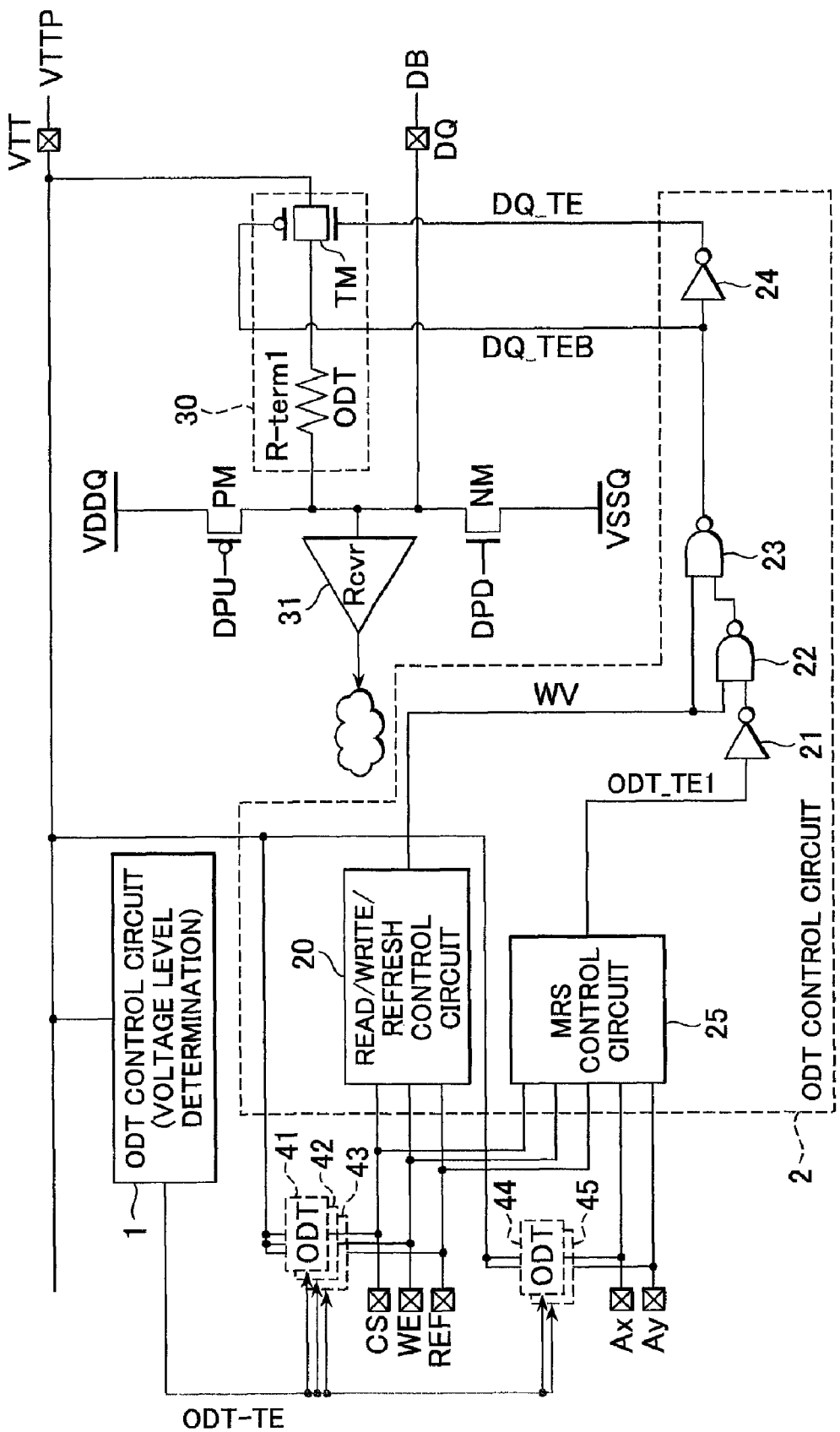
FIG. 2 is a circuit block diagram sowing a configuration of a semiconductor memory device according to a first embodiment of the present invention.

FIG. 2 shows a configuration of a semiconductor memory device according to a first embodiment of the present invention. Referring to FIG. 2, the semiconductor memory device includes ODT (On Die Termination) circuits 41 to 45, an ODT circuit 30, an ODT control circuit 1, an ODT control circuit 2, a pull-up transistor PM and a pull-down transistor NM in an output buffer, and an input buffer 31.

The pull-up transistor PM and the pull-down transistor NM are connected in series to each other. The pull-up transistor PM is connected to a power supply voltage node to which a power supply voltage VDDQ is supplied. The pull-down transistor NM is connected to a ground voltage node to which a ground voltage VSSQ is supplied. An input of the input buffer 31 is connected to an intermediate node between the pull-up transistor PM and the pull-down transistor NM. A data input/output (I/O) port DQ is connected to the intermediate node.

The ODT circuit 30 is provided between a termination voltage port VTT and the intermediate node. The ODT circuit 30 includes a termination resistance R-term1 and a switch TM. The intermediate node is connected to one end of the termination resistance R-term1. The switch TM is provided between the other end of the termination resistance R-term1 and the termination voltage port VTT. The switch TM is a transfer gate including an n-type MOS transistor and a p-type MOS transistor. The switch TM selectively couples the termination voltage port VTT with the other end of the termination resistance R-term1 in response to a termination enable signal DQ_TEB of a low level and an inverted signal DQ_TE of a high level obtained by inverting the enable signal The ODT control circuit 2 is connected between command/address input ports CS, WE, REF, Ax, and Ay and the ODT circuit 30. The ODT control circuit 2 controls the ODT circuit 30 to couple the termination voltage port VTT with the data input/output port DQ on the basis of inputs of the command/address input ports CS, WE, REF, Ax, and Ay. The ODT control circuit 2 includes a read/write/refresh control circuit 20, a MRS (Mode Register Set) control circuit 25, and a termination enable signal generating circuit. The termination enable signal generating circuit includes inverters 21 and 24 and NAND gates 22 and 23.

The inverter 21 receives an ODT enable signal ODT_TE1 from the MRS control circuit 25, and inverts and outputs the signal. The NAND gate 22 receives a signal WV from the read/write/refresh control circuit 20 and the output of the inverter 21, and outputs a NAND output signal of them. The NAND gate 23 receives the signal WV from the read/write/refresh control circuit 20 and the output of the NAND gate 22, and outputs a NAND output signal of them as a signal DQ_TEB. The inverter 24 receives the signal DQ_TEB from the NAND gate 23, and inverts the signal and outputs the inverted signal as a termination enable signal DQ_TE. The signal DQ_TEB may be obtained by inverting the signal DQ_TE.

The ports CS, WE, REF, Ax, and Ay are separated into command input ports CS, WE, and REF and address input ports Ax and Ay. A chip selection command, a write enable command, a refresh command are supplied to the command input ports CS, WE, and REF, respectively.

The read/write/refresh control circuit 20 outputs the signal WV set to a "low level" only during a valid period of data output in a read operation on the basis of the command inputs CS, WE, and REF. The signal WV is set to a "high level" representing a period other than the valid period of data output in an operation other than the read operation.

When a MRS is set on the basis of the address/command inputs ports CS, WE, REF, Ax, and Ay, the MRS control circuit 25 outputs an ODT enable signal ODT_TE1 of the "high level". When the signal WV is set to the "high level" to indicate a period other than the valid period of data output, in a state that the ODT enable signal ODT_TE1 is set to the "high level", the termination enable signal DQ_TE is set to the "high level". Accordingly, the switch TM of the ODT circuit 30 is turned on in response to the termination enable signals DQ_TE and DQ_TEB, and connects the termination voltage port VTT with the termination resistance R-term1 of the ODT circuit 30. As the result, the termination voltage port VTT is connected with the data input/output port DQ via the termination resistance R-term1 of the ODT circuit 30, and the transmission line DB is terminated.

The ODT circuits 41 to 45 are separated into command ODT circuits 41 to 43 and address ODT circuits 44 and 45. The command ODT circuits 41 to 43 are connected between the termination voltage port VTT and the command input ports CS, WE, and REF, respectively. The address ODT circuits 44 and 45 are connected between the termination voltage port VTT and the address input ports Ax and Ay, respectively.

The ODT circuits 41 to 45 have the same configuration as that of the ODT circuit 30. That is, each of the ODT circuits 41 to 45 includes the termination resistance R-term1 and the switch TM. The ODT control circuit 1 is connected to one end of the termination resistance R-term1. The switch TM is provided between the other end of the termination resistance R-term1 and the termination voltage port VTT. The switch TM is a transfer gate including an n-type MOS transistor and a p-type MOS transistor. The switch TM couples the termination voltage port VTT with the other end of the termination resistance R-term1 in response to an ODT enable signal ODT_TE0 and an inverted signal thereof. The inverted signal of the ODT enable signal ODT_TE0 may be outputted from the ODT control circuit 1, and the ODT enable signal ODT_TE0 outputted from the ODT control circuit 1 may be inverted by an inverter not shown in the figure.

The ODT control circuit 1 is connected between the termination voltage port VTT and the ODT circuits 41 to 45. The ODT control circuit 1 detects a voltage level of a voltage applied to the termination voltage port VTT, and controls the ODT circuits 41 to 45 on the basis of the detection result to couple the termination voltage port VTT with the command input ports CS, WE, REF, Ax, and Ay. This control is performed in the initialization. Specifically, the ODT control circuit 1 determines whether or not the voltage level of the voltage applied to the termination voltage port VTT is equivalent to a voltage level used as the termination voltage VTTP. When the voltage level of the voltage applied to the termination voltage port VTT reaches the voltage level used as the termination voltage VTTP, the ODT control circuit 1 outputs the ODT enable signal ODT_TE0 of the "high level" as the detection result. Thus, under a state that the ODT enable signal ODT_TE0 is set to the "high level", the switches TM of the ODT circuits 41 to 45 are turned on in response to the ODT enable signal ODT_TE0 and connect the termination voltage port VTT with the termination resistances R-term1 of the ODT circuits 41 to 45, respectively. As the result, the termination voltage port VTT is connected with the command input ports CS, WE, REF, Ax, and Ay via the termination resistances R-term1 of the ODT circuits 41 to 45, and transmission lines connected to the command input ports CS, WE, REF, Ax, and Ay are terminated.

Figure 3:
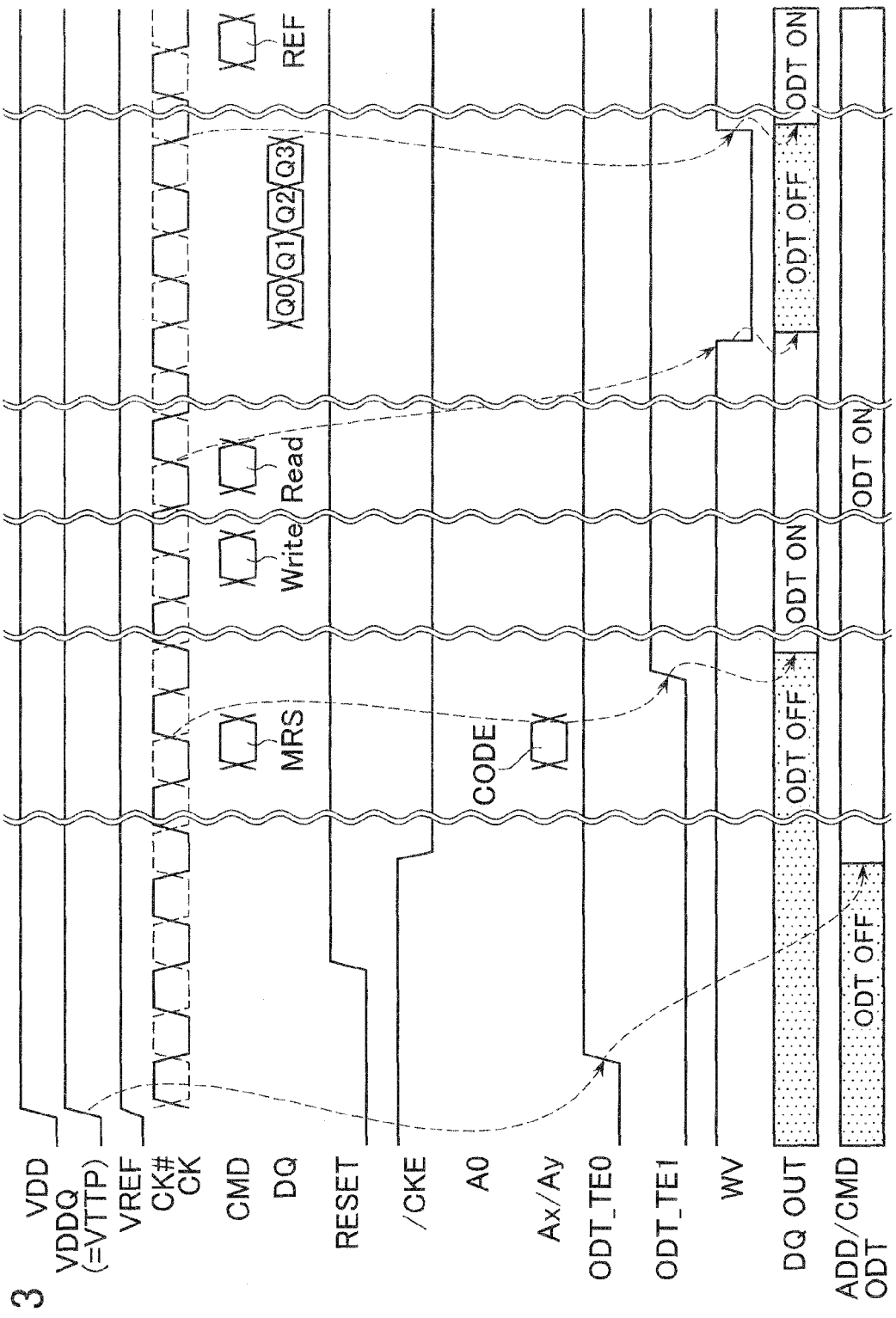
FIG. 3 shows timing charts representing an operation of the semiconductor memory device according to the first embodiment of the present invention.

FIG. 3 shows timing charts representing an operation of the semiconductor memory device according to the first embodiment of the present invention. In the ODT circuits 30 and 41 to 45, a voltage level used as the termination voltage VTTP is generally a level of a power supply voltage VDDQ or a half level of the power supply voltage VDDQ (hereinafter also referred to as 1/2VDDQ). For this reason, when the voltage level of the voltage applied to the termination voltage port VTT is fixed to a voltage level of the ground voltage VSSQ, the ODT control circuit 1 outputs the ODT enable signal ODT_TE0 as a disabled signal (a low level) On the other hand, when the voltage level VDD of the voltage applied to the termination voltage port VTT is 1/2VDDQ or more and is VDDQ or less, i.e., 1/2VDDQ=VDD=VDDQ, the ODT control circuit 1 outputs the ODT enable signal ODT_TE0 as an enabled signal (a high level). In this way, the ODT control circuit 1 controls the ODT circuits 41 to 45. The ODT control circuit 2 sets an ODT enable signal ODT_TE1 to an enabled state by using a MRS command, and sets the ODT enable signal ODT_TE1 to the enabled state (a high level) in a period other than a read determination signal output period (WV=a low level). In this manner, the ODT control circuit 2 controls the ODT circuit 30.

According to the semiconductor memory device in the first embodiment of the present invention, the termination voltage VTTP is an essential power supply in case of providing the ODT circuits 30 and 41 to 45. When the enable state and the disenable state of the ODT circuits 41 to 45 are controlled by using the voltage level of the voltage applied to the termination voltage port VTT, the ODT circuits 41 to 45 of the address/command system can be controlled without requiring unnecessary address setting and a dedicated control circuit in the initialization.

Second Embodiment

The semiconductor memory device according to a second embodiment of the present invention will be described but the same descriptions as those in the first embodiment will be omitted.

Figure 4:
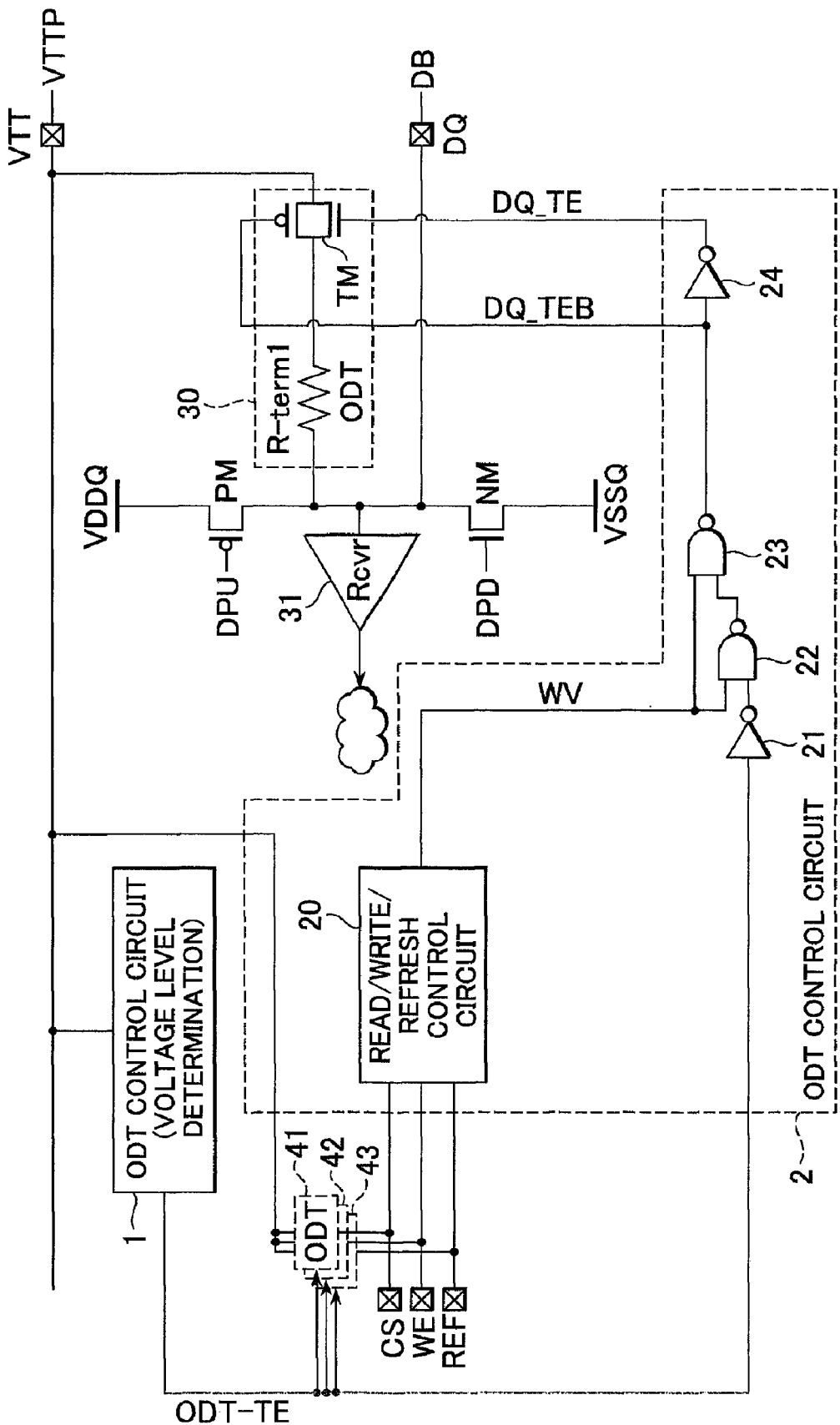
FIG. 4 is a circuit block diagram showing a configuration of the semiconductor memory device according to a second embodiment of the present invention.

FIG. 4 shows a configuration of the semiconductor memory device according to the second embodiment of the present invention. The semiconductor memory device includes the command ODT circuits 41 to 43, the ODT circuit 30, the ODT control circuit 1, the ODT control circuit 2, the pull-up transistor PM of an output buffer, the pull-down transistor NM of an output buffer, and the input buffer 31.

The connecting relation of the pull-up transistor PM, the pull-down transistor NM, the input buffer 31, and the ODT circuit 30 is the same as that in the first embodiment.

The ODT control circuit 2 is connected between the command input ports CS, WE, and REF and the ODT circuit 30. The ODT control circuit 2 controls the ODT circuit 30 to connect the termination voltage port VTT with the data input/output port DQ on the basis of inputs of the command input ports CS, WE, and REF and of a voltage level detection result from the ODT control circuit 1. This ODT control circuit 2 includes the read/write/refresh control circuit 20 and a termination enable signal generating circuit of the inverters 21 and 24 and the NAND gates 22 and 23.

The inverter 21 receives an ODT enable signal ODT_TE from the ODT control circuit 1, and inverts and outputs the signal. The NAND gate 22 receives a signal WV from the ODT control circuit 2 and the output of the inverter 21, and outputs a NAND output of them. The NAND gate 23 receives the signal WV from the ODT control circuit 2 and the output of the NAND gate 22, and outputs a NAND output of them as the above-mentioned inverted signal DQ_TEB. The inverter 24 receives the signal DQ_TEB that is an output of the NAND gate 23, and inverts the signal and outputs the inverted signal as the above-mentioned termination enable signal DQ_TE.

The read/write/refresh control circuit 20 outputs the signal WV set to the "low level" only during a valid period of data output in a read operation on the basis of inputs of the command input ports CS, WE, and REF. The signal WV is set to the "high level" representing a period other than the valid period of data output in an operation other than the read operation. When the signal WV to the "high level" to indicate a period other than the valid period of data output, under a state that the ODT enable signal ODT_TE is enabled or set to the "high level", the termination enable signal DQ_TE is enabled or set to the "high level". Accordingly, the switch TM of the ODT circuit 30 is turned on in response to the termination enable signals DQ_TE and DQ_TEB, and connects the termination voltage port VTT with the termination resistance R-term1 of the ODT circuit 30. As the result, the termination voltage port VTT is connected with the data input/output port DQ via termination resistance R-term1 of the ODT circuit 30, and the transmission line DB is terminated.

The ODT control circuit 1 is connected between the termination voltage port VTT and the ODT circuits for command 41 to 43. The ODT control circuit 1 detects a voltage level of a voltage applied to the termination voltage port VTT, and controls the command ODT circuits 41 to 43 on the basis of the detection result to connect the termination voltage port VTT with the command input ports CS, WE, and REF. This control is performed in the initialization. Specifically, the ODT control circuit 1 determines whether or not the voltage level of the voltage applied to the termination voltage port VTT is equivalent to a voltage level used as the termination voltage VTTP. When the voltage level of the voltage applied to the termination voltage port VTT reaches the voltage level used as the termination voltage VTTP, the ODT control circuit 1 outputs the ODT enable signal ODT_TE set to the "high level" as the detection result.

In this way, under a state that the ODT enable signal ODT_TE is enabled or set to the "high level", the switches TM of the command ODT circuits 41 to 43 are turned on respectively in response to the ODT enable signal ODT_TE and connect the termination voltage port VTT with the termination resistances R-term1 of the command ODT circuits 41 to 43. As the result, the termination voltage port VTT is connected with the command input ports CS, WE, and REF through the termination resistances R-term1 of the command ODT circuits 41 to 43, and transmission lines connected to the command input ports CS, WE, and REF are terminated.

Figure 5:
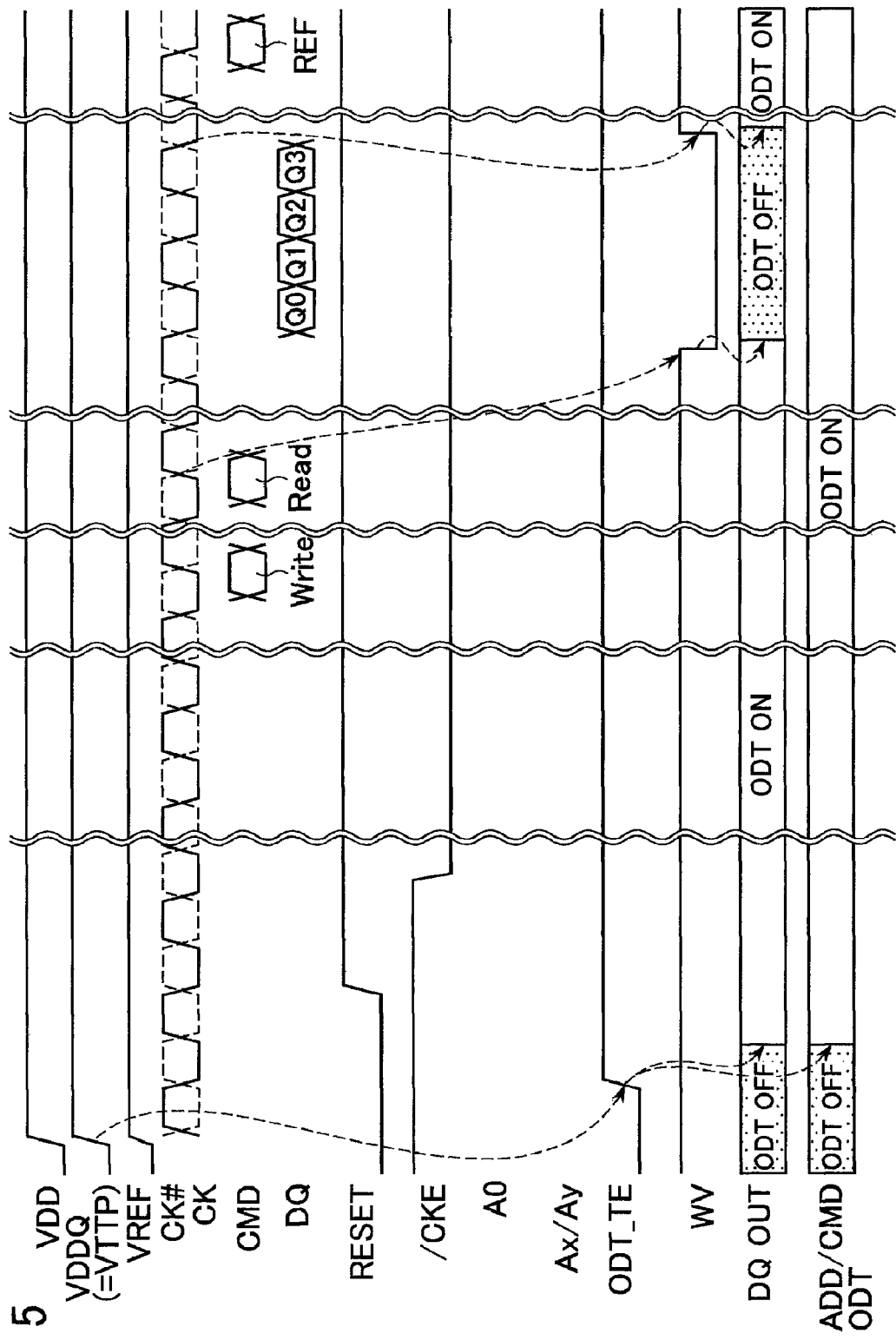
FIG. 5 shows timing charts representing an operation of the semiconductor memory device according to the second embodiment of the present invention.

FIG. 5 shows timing charts representing an operation of the semiconductor memory device according to the second embodiment of the present invention. In the ODT circuits 30 and 41 to 43, the voltage level used as the termination voltage VTTP is generally a level of a power supply voltage VDDQ or a half level of the power supply voltage VDDQ. For this reason, when the voltage level of the voltage applied to the termination voltage port VTT is fixed to a voltage level of the ground voltage VSSQ, the ODT control circuit 1 outputs the ODT enable signal ODT_TE of a disabled level (a low level). On the other hand, when the voltage level VDD of the voltage applied to the termination voltage port VTT is 1/2VDDQ or more and is VDDQ or less, i.e., 1/2VDDQ=VDD=VDDQ, the ODT control circuit 1 outputs the ODT enable signal ODT_TE of an enabled level (a high level.). Thus, the ODT control circuit 1 controls the ODT circuits for command 41 to 43. In this case, since the ODT enable signal ODT_TE is set to an enabled state, the ODT control circuit 2 controls the ODT circuit 30. In this manner, the ODT circuit 30 is controlled in accordance with the control of the ODT circuits for command 41 to 43.

According to the semiconductor memory device in the second embodiment of the present invention, the termination voltage VTTP is an essential power supply in case of providing the ODT circuits 30 and 41 to 43. When the enable state and the disenable state of the ODT circuits 30 and 41 to 43 are controlled by using the voltage level of the voltage applied to the termination voltage port VTT, the ODT circuit 30 and the command ODT circuits 41 to 43 can be controlled without requiring unnecessary address setting, a dedicated control circuit, and the MRS control circuit 25 in the first embodiment in the initialization.

Third Embodiment

The semiconductor memory device according to a third embodiment of the present invention will be described, but the same descriptions as those in the first and second embodiments will be omitted.

Figure 6:
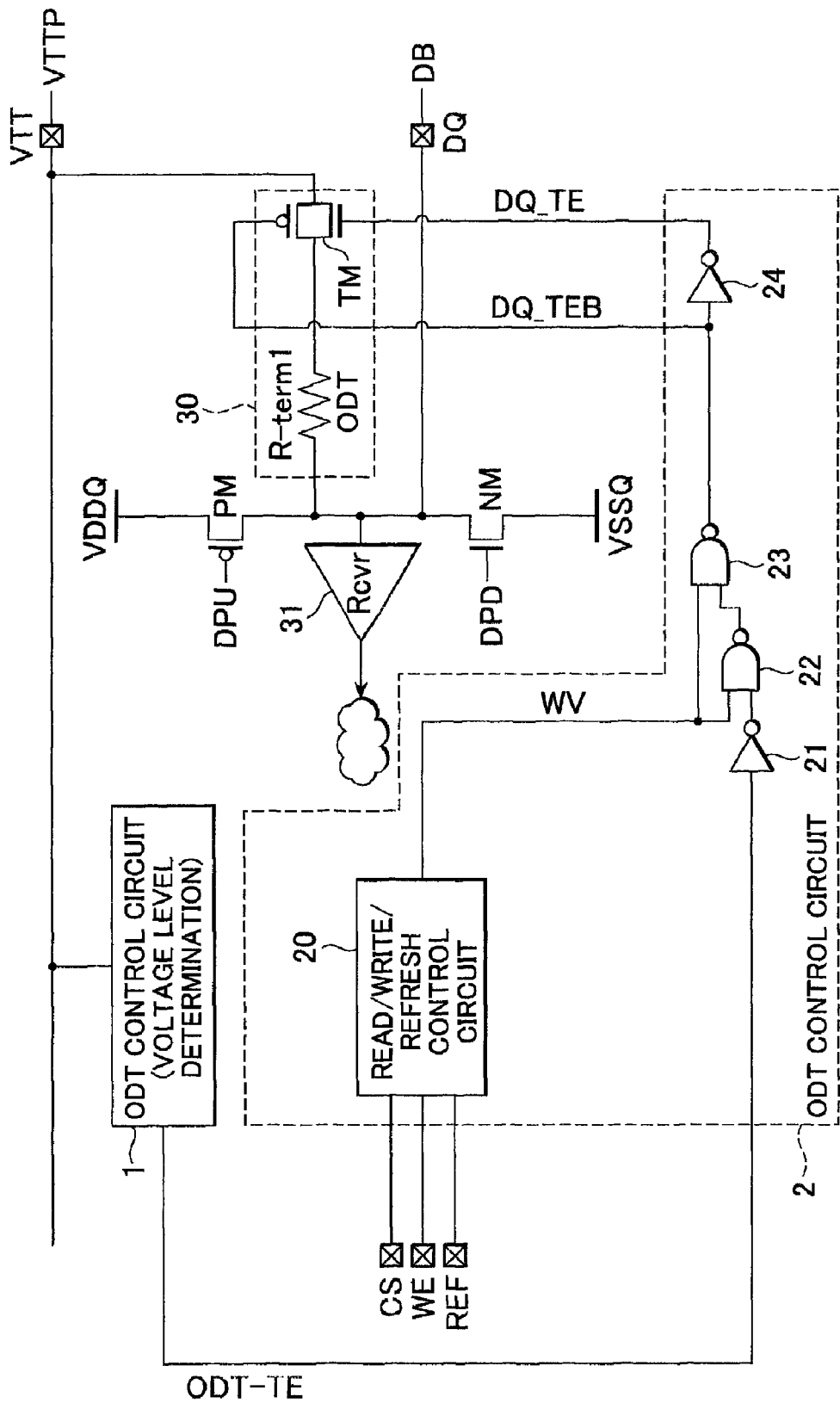
FIG. 6 is a circuit block diagram showing a configuration of the semiconductor memory device according to a third embodiment of the present invention.

FIG. 6 shows a configuration of the semiconductor memory device according to the third embodiment of the present invention. The semiconductor memory device includes the ODT circuit 30, the ODT control circuit 1, the ODT control circuit 2, the pull-up transistor PM of an output buffer, the pull-down transistor NM of an output buffer, and the input buffer 31. That is, the command ODT circuits 41 to 43 in the second embodiment are not removed.

The ODT control circuit 1 is connected to the termination voltage port VTT. The ODT control circuit 1 detects a voltage level of a voltage applied to the termination voltage port VTT, and outputs the voltage level detection result. This control is performed in the initialization. Specifically, the ODT control circuit 1 determines whether or not the voltage level of the voltage applied to the termination voltage port VTT is equivalent to a voltage level used as the termination voltage VTTP. When the voltage level of the voltage applied to the termination voltage port VTT reaches the voltage level used as the termination voltage VTTP, the ODT control circuit 1 outputs the ODT enable signal ODT_TE set to the enabled state of the "high level" as the detection result.

The ODT control circuit 2 is connected between the command input ports CS, WE, and REF and the ODT circuit 30. The ODT control circuit 2 controls the ODT circuit 30 to connect the termination voltage port VTT with the data input/output port DQ on the basis of inputs of the command input ports CS, WE, and REF and of the detection result from the ODT control circuit 1. The ODT control circuit 2 includes the read/write/refresh control circuit 20 and a termination enable signal generating circuit of the inverters 21 and 24 and the NAND gates 22 and 23. Configurations and operations of the read/write/refresh control circuit 20 and the termination enable signal generating circuit are the same as those in the second embodiment.

When the signal WV is set to the "high level" to indicate a period other than the valid period of data output under a state that the ODT enable signal ODT_TE is enabled or set to the "high level", the termination enable signal DQ_TE is enabled or set to the "high level". Accordingly, the switch TM of the ODT circuit 30 is turned on in response to the termination enable signal DQ_TE, and connects the termination voltage port VTT with the termination resistance R-term1 of the ODT circuit 30. As the result, the termination voltage port VTT is connected with the data input/output port DQ through termination resistance R-term1 of the ODT circuit 30, and the transmission line DB is terminated.

In the ODT circuits 30, a voltage level used as the termination voltage VTTP is generally a level of a power supply voltage VDDQ or a half level of the power supply voltage VDDQ. For this reason, when the voltage level of the voltage applied to the termination voltage port VTT is fixed to a voltage level of the ground voltage VSSQ, the ODT control circuit 1 outputs the ODT enable signal ODT_TE of a disabled state (a low level). On the other hand, when the voltage level VDD of the voltage applied to the termination voltage port VTT is 1/2VDDQ or more and is VDDQ or less, i.e., 1/2VDDQ=VDD=VDDQ, the ODT control circuit 1 outputs the ODT enable signal ODT_TE of an enabled state (a high level). In this case, since the ODT enable signal ODT_TE is set to an enabled state, the ODT control circuit 2 controls the ODT circuit 30. In this manner, only the ODT circuit 30 is controlled.

According to the semiconductor memory device in the third embodiment of the present invention, the termination voltage VTTP is an essential power supply in case of providing the ODT circuits 30. When the enable state and the disenable state of the ODT circuits 30 are controlled by using the voltage level of the voltage applied to the termination voltage port VTT, the command ODT circuits 30 can be controlled without requiring unnecessary address setting, a dedicated control circuit, and the MRS control circuit 25 in the first embodiment in the initialization.

Although the present invention has been described above in connection with several embodiments thereof, it would be apparent to those skilled in the art that those embodiments are provided solely for illustrating the present invention, and should not be relied upon to construe the appended claims in a limiting sense.

What is claimed is:

1. A semiconductor memory device, comprising:
   a first ODT (On Die Termination) circuit provided between a termination voltage port and a command input port; and
   a first ODT controlling circuit provided between said termination voltage port and said first ODT circuit, and configured to detect a level of a voltage applied to said termination voltage port and to control said first ODT circuit to connect said termination voltage port and said command input port based on the detection result,
   wherein said first ODT controlling circuit controls said first ODT circuit to connect said termination voltage port and said command input port based on the detection result, when the detected voltage level reaches a voltage level which is used as a termination voltage level.

2. The semiconductor memory device according to claim 1, further comprising:
a second ODT circuit provided between said termination voltage port and a data I/O port; and
a second ODT controlling circuit provided between said second ODT circuit and said command input port and configured to control said second ODT circuit to connect said termination voltage port and said data I/O port based on an input to said command input port.

3. The semiconductor memory device according to claim 1, further comprising:
a second ODT circuit provided between said termination voltage port and a data I/O port; and
a second ODT controlling circuit provided between said command input port and said second ODT circuit, and configured to control said second ODT circuit to connect said termination voltage port and said data I/O port based on an input to said command input port and the detection result from said first ODT controlling circuit.

4. The semiconductor memory device according to claim 1, wherein said first ODT circuit comprises:
a termination resistance having one end connected with said first ODT controlling circuit; and
a switch connected between the other end of said termination resistance and said termination voltage port and configured to connect said termination voltage port and said command input port through said termination resistance in response to an ODT enable signal, and
said first ODT controlling circuit outputs the ODT enable signal based on the detection result.

5. The semiconductor memory device according to claim 1, further comprising a buffer, wherein said first ODT circuit comprises:
a first termination resistance having one end connected with said first ODT controlling circuit; and
a first switch provided between the other end of said first termination resistance and said first termination voltage port and configured to connect said termination voltage port and said command input port through said first termination resistance in response to an ODT enable signal,
wherein said second ODT circuit comprises:
a second termination resistance having one end connected with said buffer; and
a second switch provided between the other end of said second termination resistance and said termination voltage port and configured to connect said termination voltage port and a data I/O port through said second termination resistance in response to a termination enable signal,
said first ODT controlling circuit outputs the ODT enable signal based on the detection result, and
said second ODT controlling circuit outputs the termination enable signal based on an input to said command input port.

6. The semiconductor memory device according to claim 3, further comprising a buffer, wherein said first ODT circuit comprises:
a first termination resistance having one end connected with said first ODT controlling circuit; and
a first switch provided between the other end of said first termination resistance and said termination voltage port and configured to connect said termination voltage port and said command input port through said first termination resistance in response to an ODT enable signal,
said second ODT circuit comprises:
a second termination resistance having one end connected with said buffer; and
a second switch provided between the other end of said second termination resistance and said termination voltage port and configured to connect said termination voltage port and a data I/O port through said second termination resistance in response to a termination enable signal,
said first ODT controlling circuit outputs the ODT enable signal based on the detection result, and
said second ODT controlling circuit outputs the termination enable signal based on the input to said command input port and the ODT enable signal from said first ODT controlling circuit.

7. A semiconductor memory device comprising:
an ODT circuit provided between a termination voltage port and a data I/O port;
a first ODT controlling circuit connected with said termination voltage port and configured to detect a level of a voltage applied to said termination voltage port and to output the detection result; and
a second ODT controlling circuit provided between said command input port and said ODT circuit and configured to control said ODT circuit to connect said termination voltage port and said data I/O port based on an input to said command input port and the detection result from said first ODT controlling circuit.

8. The semiconductor memory device according to claim 7 wherein said first ODT controlling circuit outputs the detection result, when the detected voltage level of the voltage applied to said termination voltage port reaches a voltage level which is used as a termination voltage.

9. The semiconductor memory device according to claim 7, further comprising a buffer, wherein said ODT circuit comprises:
a termination resistance having one end connected with said buffer; and
a switch provided between the other end of said termination resistance and said termination voltage port and configured to connect said termination voltage port and said data I/O port through said termination resistance in response to a termination enable signal,
said first ODT controlling circuit outputs an ODT enable signal based on the detection result, and
said second ODT controlling circuit outputs the termination enable signal based on an input to said command input port and the ODT enable signal from said first ODT controlling circuit.

10. A termination method, comprising: detecting a voltage level of a voltage applied to a termination voltage port; and
controlling a first ODT (On Die Termination) circuit provided between said termination voltage port and a command input port based on the detection result to connect said termination voltage port and said command input port when the detected level of the voltage applied to said termination voltage port reaches a voltage level used as a termination voltage, controlling said first ODT circuit based on the detection result to connect said termination voltage port and said command input port.

11. The termination method according to claim 10, further comprising:
controlling a second ODT circuit provided between said termination voltage port and said data I/O port based on an input to said command input port to connect said termination voltage port and said data I/O port.

12. The termination method according to claim 10, further comprising:
controlling a second ODT circuit provided between said termination voltage port and said data I/O port based on an input to said command input port and the detection result from said first ODT controlling circuit to connect said termination voltage port and said data I/O port.

13. A termination method, comprising:
detecting a level of a voltage applied to a termination voltage port to output the detection result;
controlling an ODT circuit provided between said termination voltage port and a data I/O port based on the detection result and an input to a command input port to connect said termination voltage port and said data I/O port; and
outputting the detection result when the voltage level of the voltage applied by said termination voltage port reaches a voltage level which is used as the termination voltage.

* * * * *